(12) United States Patent
Chai et al.

(10) Patent No.: US 6,455,986 B2
(45) Date of Patent: Sep. 24, 2002

(54) ELECTRONIC DEVICE INCLUDING LANGASITE STRUCTURE COMPOUND AND METHOD FOR MAKING SUCH DEVICES

(75) Inventors: Bruce H. T. Chai, Oviedo; Mitch M. C. Chou, Sanford; Haihong Qiu, Oviedo; Shen Jen, Lake Mary, all of FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 0 days.

(21) Appl. No.: 09/848,715

(22) Filed: May 3, 2001

Related U.S. Application Data

(60) Provisional application No. 60/201,435, filed on May 3, 2000.

(51) Int. Cl.$^7$ ............................................. H01L 41/04
(52) U.S. Cl. .................................... 310/358; 310/313 A
(58) Field of Search ............................ 310/313 A, 358, 310/360; 256/62.9 R

(56) References Cited

U.S. PATENT DOCUMENTS

| | | | |
|---|---|---|---|
| 6,163,099 A | 12/2000 | Kadota et al. ............ | 310/313 A |
| 2002/0015452 A1 * | 2/2002 | Chai et al. ................ | 375/316 |
| 2002/0021193 A1 * | 2/2002 | Chai et al. ................ | 333/187 |
| 2002/0027397 A1 * | 3/2002 | Chai et al. ............... | 310/313 R |

OTHER PUBLICATIONS

Mill et al, "Langasite–type Materials: From Discovery to Present State," Apr. 2000, 2000 IEEE/EIA Inter. Freq. Sym. and Exh., pp. 133–144.*

Chai et al., 1999 Joint Meeting EFTF–IEEE IFCS, *Growth of High Quality Single Domain Crystals of Langasite Family Compounds*, Crystal Photonics, Inc., pp. 821–828.

Mill et al., 1999 Joint Meeting EFTF–IEEE IFCS, *Synthesis, Growth and some Properties of Single Crystals with the $Ca_2Ga_2Ge_4O_{14}$ Structure*, Moscow State University, pp. 829–834.

Takeda et al., *Synthesis and Characterization of $Sr_3TaGa3Si_2O_{14}$ Single Crystals*, Materials Research Bulletin 35 (2000), pp. 245–252.

Chai et al., *A New Class of Ordered Langasite Structure Compounds*, Crystal Photonics, Inc., CREOL, University of Central Florida, 2000, pp. 163–168.

\* cited by examiner

*Primary Examiner*—Nestor Ramirez
*Assistant Examiner*—Peter Medley
(74) *Attorney, Agent, or Firm*—Allen, Dyer, Doppelt, Milbrath & Gilchrist, P.A.

(57) ABSTRACT

An electronic device includes a piezoelectric layer formed of an ordered Langasite structure compound having the formula $A_3BC_3D_2E_{14}$ wherein A is strontium, B is niobium, C is gallium, D is silicon, and E is oxygen. At least one electrode is connected to the piezoelectric layer and may be configured to define a device, such as a SAW resonator or filter, or a BAW resonator or filter. The ordered Langasite structure compound may have a substantially perfectly ordered structure.

32 Claims, 2 Drawing Sheets

ELECTRONIC DEVICE INCLUDING LANGASITE STRUCTURE COMPOUND AND METHOD FOR MAKING SUCH DEVICES

RELATED APPLICATION

The present application is based upon copending provisional application Ser. No. 60/201,435 filed on May 3, 2000, the entire contents of which are incorporated herein by reference.

FIELD OF THE INVENTION

This invention relates to electronic devices, such as resonators and filters, and more particularly to such devices including a Langasite structure compound and associated methods.

BACKGROUND OF THE INVENTION

Bulk acoustic wave (BAW) and surface acoustic wave (SAW) devices are two key components in today's wireless electronic systems. These devices serve the two major functions of signal processing and frequency control. The signal processing function involves filtering of electrical signals which typically have a frequency ranging from several MHZ up to several GHz and a fractional passband from as low as less than a few hundredths of a per-cent up to tens of a per-cent.

The frequency control function involves generating a precise clock signal or a frequency source whose frequency ranges between several MHZ up to several hundred MHZ. Passive BAW and SAW filters as well as BAW and SAW resonator based clocks and oscillators have been, and will continue to be, the mainstay for these signal processing and frequency control applications.

BAW and SAW filters and resonators are electromechanical devices operated based upon the piezoelectric effect. The piezoelectric materials used for BAW and SAW devices are predominantly of single crystal form. Fundamentally the performance of acoustic wave devices depends on the piezoelectric crystal's electromechanical coupling strength, its inherent acoustic loss, and its temperature stability.

Another material property of interest for BAW and SAW device construction is the acoustic velocity. The merit of acoustic velocity depends on desired application. For example, higher velocity crystals allow fabrication of devices with higher operating frequencies. On the other hand, for certain SAW filter constructions, namely the ones involving classical transversal filters, a higher velocity crystal substrate may suffer from a larger required device size.

The electromechanical coupling strength dictates the efficiency of energy conversion from electrical to acoustic energy and vice versa, and is thus important to the device insertion loss. The inherent acoustic loss also affects the device insertion loss. Perhaps more importantly the inherent acoustic loss manifests itself into affecting the fidelity of the BAW and SAW resonators in the form of the resonance quality factor Q. This has a direct bearing on the frequency stability of the oscillator constructed using the resonator. A "material Q factor" has long been recognized in the field of crystal (BAW) resonators and oscillators, and later adapted by workers in the SAW resonator field.

The maximum material Q, established empirically, is inversely proportional to the device frequency. For a given piezoelectric material, this corresponds to a constant $Q_{max} \cdot f$ factor. For example, for the commonly used BAW and SAW crystal cuts:

$(Q_{max} \cdot f)_{BAW} = 1.6 \times 10^{13}$ Hz for AT and SC cuts
$(Q_{max} \cdot f)_{SAW} = 1.1 \times 10^{13}$ Hz for ST cut The temperature stability of the piezoelectric crystal dictates how stable, typically in terms of device frequency in parts per million, an acoustic device performs with changing ambient temperature.

The compound Langasite ($La_3Ga_5SiO_{14}$, LGS) was first reported in Russia back in 1980 with a $Ca_3Ga_2Ge_4O_{14}$ type structure. It was found then to have attractive laser, electromechanical and acoustic properties. Interest in LGS has grown in recent years for acoustic device applications. LGS has the same point group (32) symmetry as quartz. Similar to quartz, it has temperature compensated crystal orientations suitable for building temperature-stable BAW and SAW devices.

In comparison with quartz it has the advantage of higher electromechanical coupling strength. With a slower acoustic velocity, it has the potential for miniaturized wideband SAW filters suitable for hand-held mobile wireless devices, for example. LGS was also cited for its potential of lower acoustic loss due to the heavier atomic species of La and Ga, although LGS actually has higher acoustic loss than quartz due to its disordered structure.

Langasite is not unique with these attractive properties. It is just one crystal belonging to a very large family of crystals which have the same structure, and which are called the Langasite family compounds. In fact, compounds within this family typically have quite similar properties. In other words, they are non-centro-symmetric and thus piezoelectric. But they do have some variation due to the difference in composition of each compound. The constants that can be affected by composition include the lattice constant, thermal expansion coefficient, acoustic velocity, dielectric constant, and electromechanical coupling constant, as well as the temperature coefficients of all these constants. These variations, in general, are small (within a factor of 2 or less) but still can have a very significant effect on the device performance.

The Langasite structure is very complex for anhydrous compounds. It has four distinct cation sites. They include three dodecahedral (Site A), one octahedral (Site B), three large tetrahedral (Site C) and two small tetrahedral (Site D) sites. Each site can only accommodate a certain size and charge of the cations. Even with this constraint, nearly one hundred combinations of the cation composition are possible within the structure. Each combination must satisfy the charge neutrality requirement. In almost all the cases, it is necessary to fit a specific site with more than one type of element with different ionic charges in order to satisfy the charge neutrality. This kind of charge balance process creates disorder for the particular site and thus the whole crystal.

For example, LGS has three La ions in the dodecahedral site, one Ga ion in the octahedral site, three Ga ions in the large tetrahedral site and finally one Ga ion and one Si ion in the small tetrahedral sites. The locations of both Ga and Si ions are totally random (or "disordered") within the smaller tetrahedral site. Since Ga is 3+ charged and Si is 4+ charged, there is a disorder of ionic charge. In addition, since Ga and Si have a difference in ionic size, mass and density, this creates additional disorder in the lattice of the crystal. Another example is Langanite ($La_3Nb_{0.5}Ga_{5.5}O_{14}$, LGN) where the disorder is located at the single octahedral sites. In this case, half of the octahedral sites are occupied by Nb ions, and the other half occupied by Ga ions. Thus the charge difference is even higher than LGS with Nb 5+ charged and Ga 3+ charged. A third example is CGG ($Ca_3Ga_2Ge_4O_{14}$).

Here the disorder is located at the large tetrahedral site where ⅔ of the sites are occupied by Ge with a 4+ charge and ⅓ of the sites are occupied by Ga with a 3+ charge.

A fourth example is NSGG ($NaSr_2GaGe_5O_{14}$). Here the disorder is located at the dodecahedral site where ⅔ of the sites are occupied by Sr with a 2+ charge and ⅓ of the sites are occupied by Na with a 1+ charge.

A fifth example is LSFG ($LaSr_2Fe_3Ge_3O_{14}$). Here the disorder occurs in two different sites. The first one is the dodecahedral site where ⅓ of the sites are occupied by La with a 3+ charge and ⅔ of the sites are occupied by Sr with a 2+ charge. The second one is the large tetrahedral site where ⅔ of the sites are occupied by Fe with a 3+ charge and ⅓ of the sites are occupied by Ge with a 4+ charge.

Structure disorder may not be a desirable feature for crystals to be used in certain acoustic and optical applications. The classic example is glass. Glass is totally disordered from a structural point of view. Even though it has good optical transmission, it is not a good laser host because the local disorder of the lazing element causes non-homogeneous broadening of the emission and a lower gain cross-section.

The problem of disorder for acoustic applications is the typically high acoustic loss. Disorder induces high acoustic friction due to incoherent phonon scattering. Low acoustic loss may, however, be a highly desirable property for both resonator and filter applications. To enhance the crystal performance, it may be desirable to have a perfectly ordered structure. In other words, each site in the lattice structure will have only one specific ion located in it and not a mixture of multiple ions.

It should be noted that, despite the disordered structure, high quality single crystal Y-cut Langasite isomorphs LGN and LGT ($La_3Ta_{0.5}Ga_{5.5}O_{14}$) have already been demonstrated to show higher material Q than quartz, with $Q_{max} \cdot f$ product reaching as high as $(Q_{max} \cdot f)_{LGN\ BAW}=2.2 \times 10^{13}$ Hz and $(Q_{max} \cdot f)_{LGT\ BAW}=2.9 \times 10^{13}$ Hz.

In the case of the Langasite structure compounds, essentially all the known La containing compositions have disorder structures in at least one cation site. Some of the examples include LGS, LGN and LGT. However, there is one exception, LTG ($La_3TiGa_5O_{14}$), which has a totally ordered structure. This, in fact, may be the most ideal composition for the La containing Langasite compound from both a structure and composition point of view. This compound can be synthesized by solid state sintering reaction and is thermodynamically stable.

Applicants have tried to grow a single crystal of LTG, but found that it is not possible to grow it directly from the melt, because of the reduction of $Ti^{4+}$ to $Ti^{3+}$ under the growth conditions where the iridium crucible is stable. As a consequence, there were not sufficient 4+ charge ions in the melt to produce LTG.

Even though charge neutrality may be the most important factor controlling the composition of Langasite structure compounds, it is not the only factor. The ionic size and also the thermal stability should also be considered to make the composition compatible. The choice of cations to fit into any specific site is a very difficult task with no guarantee that the selected combination will work. The reason is that there is not sufficient data to predict its thermodynamic properties. Unless the selected composition has the lowest free energy, the compound will not exist. The only way to prove its existence is to actually synthesize the compound according to the proposed composition. When the composition is properly selected, it is possible to fit each cation into a specific site with a total balance of electric charge.

An article by B. V. Mill, et al., "Synthesis, Growth and Some Properties of Single Crystals with the $Ca_3Ga_2Ge_4O_{14}$ Structure", Proc. 1999 Joint Meeting EFTF—IEEE IFCS, pp. 829–834 discloses numerous synthesized Langasite family compositions, among which are the group of $A^{2+}_3X^{5+}Y^{3+}_3Z^{4+}_2O_{14}$, with A=Ca, Sr, Ba, Pb; X=Sb, Nb, Ta; Y=Ga, Al, Fe, In; Z=Si, Ge. The article identifies nine individual compounds that are grown according to the Czochralski technique, and of these only three were further identified as having a good chance to become piezoelectric materials for digital mobile communications systems and other acoustic applications in the $21^{st}$ century. These three materials are $La_3Ga_5SiO_{14}$, $La_3Nb_{0.5}Ga_{5.5}O_{14}$ and $La_3Ta_{0.5}Ga_{5.5}O_{14}$.

An article by H. Takeda, et al., "Synthesis and Characterization of $Sr_3TaGa_3Si_2O_{14}$ Single Crystals", Material Research Bulletin, vol. 35 (2000), pp. 245–252, cited previous work of polycrystal STGS by Mill, et al., (Russ. Jour. Inorg. Chem., vol. 43, p. 1168 (1998), and disclosed the synthesis and characterization of $Sr_3TaGa_3Si_2O_{14}$ (STGS). The article further disclosed that STGS resonators were prepared and the piezoelectric properties thereof were determined.

Despite continuing development in the area of Langasite structure compounds for electronic devices, there still exists a need for further development work to identify and produce such compounds with desirable properties and that can be used to produce high frequency electronic devices.

SUMMARY OF THE INVENTION

In view of the foregoing background, it is therefore an object of the present invention to provide electronic devices, such as for signal processing or frequency control applications that include a piezoelectric layer based on a Langasite structure that is readily manufacturable and/or which enjoys advantageous operating characteristics.

This and other objects, features and advantages in accordance with the present invention are provided by an electronic device comprising a piezoelectric layer including an ordered Langasite structure compound having the formula $A_3BC_3D_2E_{14}$, wherein A is strontium, B is niobium, C is gallium, D is silicon, and E is oxygen; and at least one electrode connected to the piezoelectric layer. The ordered Langasite structure compound may have a substantially perfectly ordered structure.

In comparison with the established material of choice to-date, quartz, the ordered Langasite structure compound of the present invention enjoys a lower acoustic loss and higher material Q due, possibly due to the perfect ordering and heavy elements. The ordered Langasite structure compound may also enjoy a higher electromechanical coupling factor possibly due to stronger piezoelectric effect resulting from the crystal structure and Nb or Ta in the octahedral sites. These factors may be important for high performance bulk and surface acoustic wave devices, for example. Furthermore, the crystal symmetry of point group 32 may provide temperature compensated orientations with which devices can be manufactured for minimal temperature variation induced frequency and group delay shifts.

The at least one electrode may comprise a plurality of electrodes configured so that the electronic device is a resonator, for example. The plurality of electrodes may be connected to a same face of the piezoelectric layer so that the electronic device is a surface acoustic wave (SAW) resonator. In particular, the plurality of electrodes may comprise first and second interdigitated electrodes in some resonator embodiments.

The plurality of electrodes may also comprise first and second electrodes connected to respective opposing first and second faces of the piezoelectric layer so that the electronic device is a bulk acoustic wave (BAW) resonator.

In other embodiments of the electronic device, the at least one electrode may comprise a plurality of pairs of electrodes configured so that the electronic device is a filter. Each of the plurality of pairs of electrodes may include first and second interdigitated electrodes. Moreover, the plurality of pairs of electrodes may be connected to a same face of the piezoelectric layer so that the electronic device is a surface acoustic wave (SAW) filter. In other embodiments, the plurality of pairs of electrodes may comprise first and second pairs of electrodes connected to respective opposing first and second faces of the piezoelectric layer so that the electronic device is a bulk acoustic wave (BAW) filter.

The ordered Langasite structure compound may be readily producible using a melt pulling crystal growth technique, especially since the components have congruent melting properties. In addition, the ordered Langasite structure compound may have a relatively high thermally stability.

A method aspect of the invention is for making an electronic device. The method may include providing a piezoelectric layer comprising an ordered Langasite structure compound having the formula $A_3BC_3D_2E_{14}$, wherein A is strontium, B is niobium, C is gallium, D is silicon, and E is oxygen; and connecting at least one electrode to the piezoelectric layer. The ordered Langasite structure compound may have a substantially perfectly ordered structure.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is directed to electronic devices, such as for filtering or clock signal generation, for example. These devices preferably comprise a piezoelectric layer including an ordered Langasite structure compound having the formula $A_3BC_3D_2E_{14}$ wherein A is strontium, B is niobium, C is gallium, D is silicon, and E is oxygen. Each device also preferably includes at least one electrode connected to the piezoelectric layer. The ordered Langasite structure compound may have a substantially perfectly ordered structure.

Briefly, in comparison with the established material of choice to-date, quartz, the ordered Langasite structure compound of the present invention enjoys a lower acoustic loss and higher material Q due, possibly due to the perfect ordering and heavy elements. The ordered Langasite structure compound may also enjoy a higher electromechanical coupling factor possibly due to stronger piezoelectric effect resulting from the crystal structure and Nb in the octahedral sites. These factors may be important for high performance bulk and surface acoustic wave devices, for example. Furthermore, the crystal symmetry of point group 32 may provide temperature compensated orientations with which devices can be manufactured for minimal temperature variation induced frequency and group delay shifts.

Figure 1:
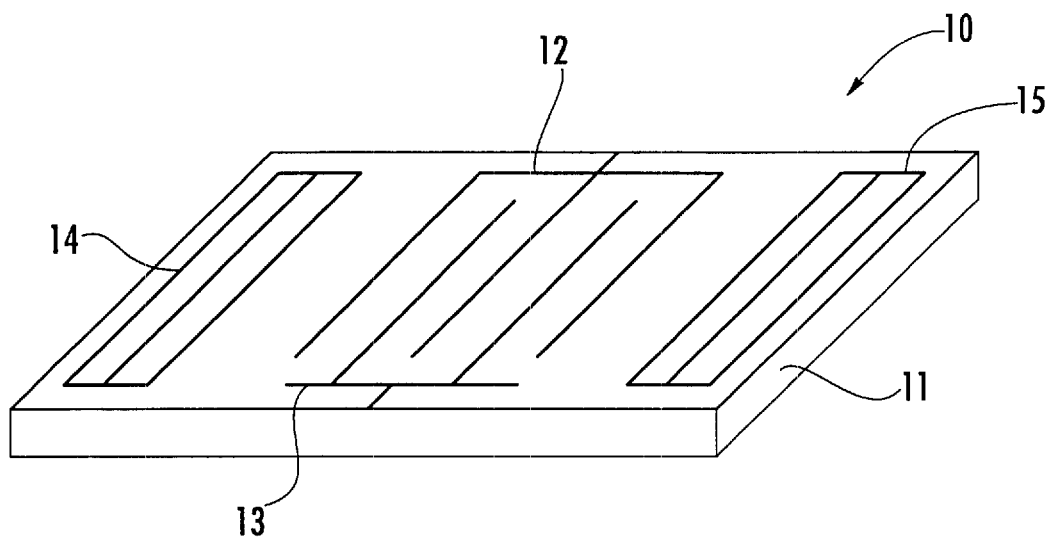
FIG. 1 is a perspective schematic view of a SAW resonator in accordance with the present invention.
Figure 2:
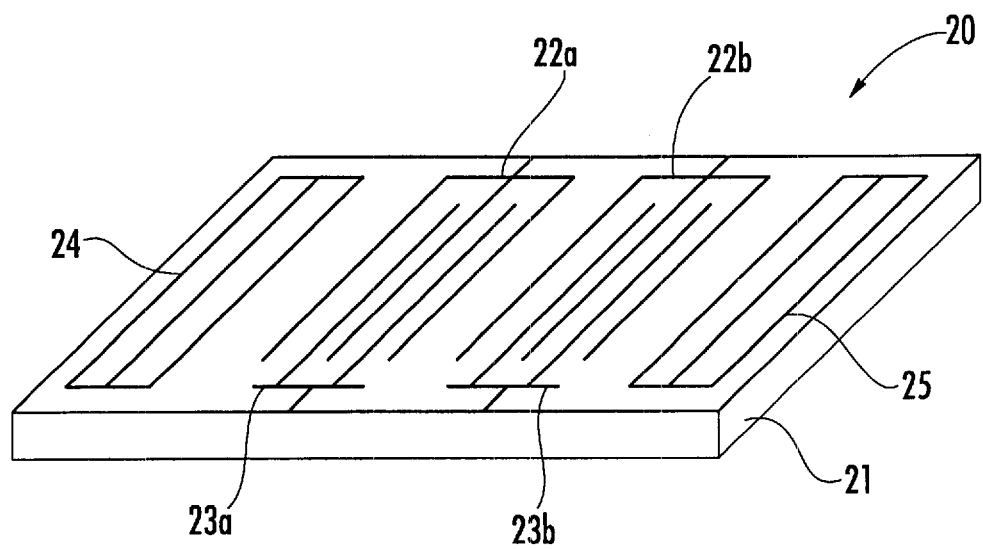
FIG. 2 is a perspective schematic view of a SAW filter in accordance with the present invention.

Representative of these electronic devices, for example, are the SAW resonator 10 (FIG. 1), the SAW filter 20 (FIG. 2), the BAW resonator 30 (FIG. 3) and the BAW filter 40 (FIG. 4), respectively, each of which is now described in greater detail starting first with the SAW resonator. The illustrated SAW resonator 10 includes a piezoelectric layer 11 formed of one of the ordered Langasite compounds described herein, and a pair of interdigitated electrodes 12, 13 on an upper face thereof. Passive end reflecting electrodes 14, 15 are also shown in the illustrated embodiment. Of course, those of skill in the art will recognize other arrangements or configurations of electrodes defining a SAW resonator as contemplated by the present invention. Moreover, those of skill in the art will also appreciate that the SAW resonator 10 can be used in a number of clock or other precise frequency signal generating circuits, for example.

The SAW filter 20 as shown in FIG. 2 again includes a piezoelectric layer 21 formed of SNGS as described herein. A first pair of interdigitated electrodes 22a, 23a are illustratively formed on or connected to the upper face of the layer 21. A second pair of interdigitated electrodes 22b, 23b are also formed on or connected to the upper face in spaced relation from the first pair. In the illustrated embodiment, optional passive end electrodes 24, 25 are also provided. Those of skill in the art will also appreciate other equivalent configurations of electrodes that will produce a SAW filter as contemplated by the present invention. Those of skill in the art will appreciate that the SAW filter 20 can be used in any of a number of high frequency filtering circuits, such as particularly for those used in portable wireless communications devices, such as cellular telephones.

Figure 3:
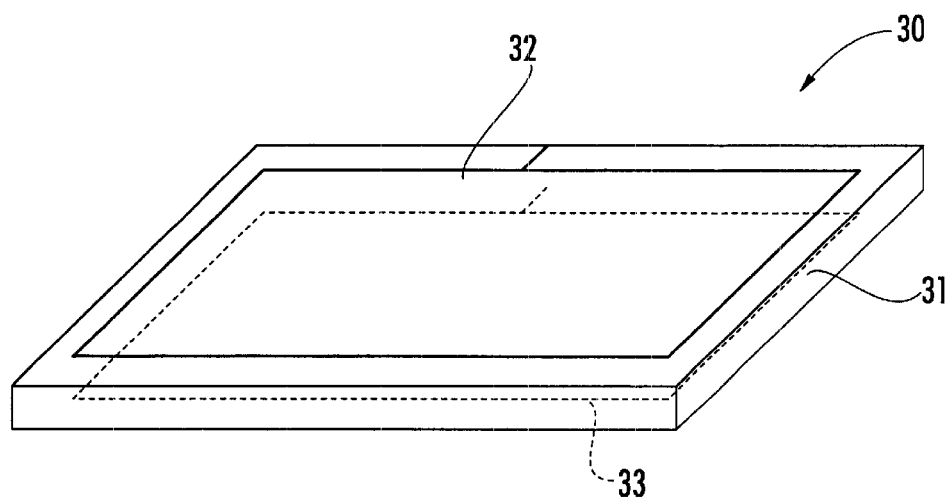
FIG. 3 is a perspective schematic view of a BAW resonator in accordance with the present invention.
Figure 4:
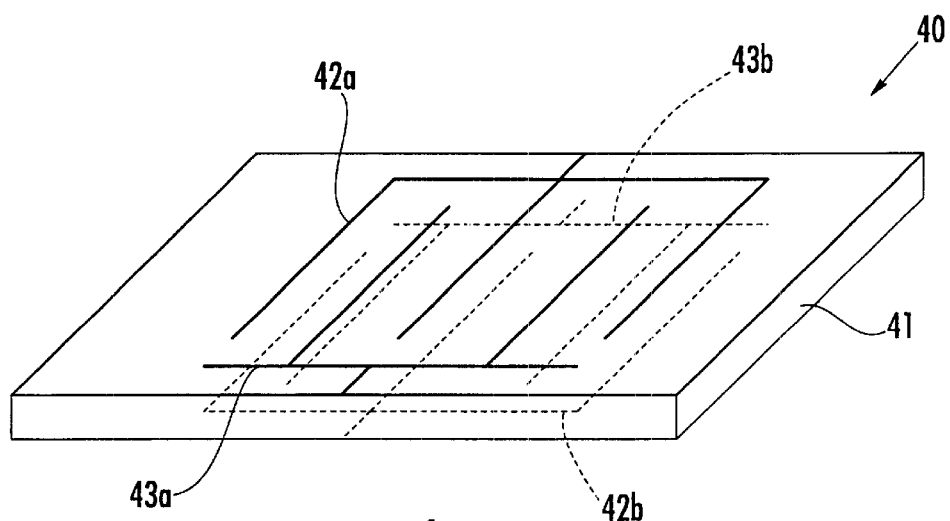
FIG. 4 is a perspective schematic view of a BAW filter in accordance with the present invention.

Turning now more specifically to FIGS. 3 and 4, two BAW devices will now be explained which also advantageously are formed using the ordered Langasite compounds SNGS. The BAW resonator 30 includes the piezoelectric layer 31 having a first or upper face on which a first patch electrode 32 is illustratively provided. Correspondingly, a second patch electrode 33 is provided on the lower face of the layer 31. Operation of the BAW resonator will readily appreciated by those skilled in the art without further discussion herein. In addition, those of skill in the art will also appreciate that other electrode configurations for the BAW resonator 30 are also contemplated by the present invention.

The BAW filter 40 is further explained with specific reference to FIG. 4. The BAW filter 40 also illustratively includes a piezoelectric layer 41 formed of SNGS as described herein. In the illustrated embodiment, a first pair of interdigitated electrodes 42a, 43a are formed on a first or upper surface of the piezoelectric layer 41, and second pair of interdigitated electrodes 42b, 43b are formed or connected to the second or lower face of the piezoelectric layer. Other configurations of electrodes are also contemplated by the invention as will be appreciated by those skilled in the art. Those of skill in the art will also appreciate the many varied electronic circuit applications for the BAW filter 40 without further discussion herein.

Having now described a number of exemplary electronic devices including the SAW resonator 10, the SAW filter 20, the BAW resonator 30, and the BAW filter 40 that may use the SNGS piezoelectric materials of the present invention, those of skill in the art will appreciate other similar electronic devices. Accordingly, Applicants now further describe additional features and characteristics of the ordered Langasite structure compound, SNGS.

The Langasite structure compound has four distinct cation sites. However, it is interesting to know that only the cation size of the large tetrahedral site may be the most critical one to determine the stability of this structure. This site requires ions with the radius around 0.6 Å. The only ions that have such size and can satisfy the electric charge requirement are $Ga^{3+}$ and $Ge^{4+}$.

In fact, a majority of the Langasite structure compounds contain germanium. However, in accordance with this invention, the Ge-containing Langasite structures are eliminated from consideration. The reason is not because of the order-disorder structure, but rather because of the thermal stability. $GeO_2$ has too low a thermal stability and evaporates profusely under melting condition. It is not possible to grow large, high quality single crystals of Ge-containing Langasite using the current known melt pulling techniques. Therefore, Applicants have concentrated only on the ordered Ga-containing Langasite structure compounds.

Since it is not possible to make ordered-structure La-containing Langasite compounds, Applicants switch to the alkali-earth containing Langasite structure compounds. Two possible compositions that are possible to fulfill both the charge neutrality and site selection requirements and still retain an ordered structure is SNGS—$Sr_3NbGa_3Si_2O_{14}$, One should notice that the germanium equivalent compounds also satisfy the same requirement. However, Si is selected over Ge because $SiO_2$ has much higher temperature stability and does not evaporate at the melting temperature of these compositions.

Since the $Si^{4+}$ ion is much smaller than the $Ge^{4+}$ ion, it reduces the lattice constants quite significantly. It was found possible to produce high quality single crystals of SNGS. Applicants also theorize that BNGG ($Ba_3NbGa_3Ge_2O_4$) and BTGG ($Ba_3TaGa_3Ge_2O_{14}$) compounds can be synthesized since other Ba-containing Langasite structure compounds do exist such as BGG ($Ba_3Ga_2Ge_4O_4$), although conventional melt flow pulling techniques may not be sufficient.

The demonstration of the existence of a particular composition is just the first step towards the production of a crystal. It shows that this composition is indeed thermodynamically stable. To be able to grow a crystal directly from melt, it is needed to demonstrate that this composition is stable all the way to melting without any solid state phase transition nor thermal dissociation.

At the same time, a melt with this property will crystallize a crystal with the same composition as the melt. This property is called congruent melting. Congruent melting may be highly desirable for practical crystal production, but a much harder property to realize. In fact, the majority of the known compounds do not melt congruently. The likelihood to be congruently melting decreases dramatically as the number of components in the melt increases.

For example, essentially all single element melts are congruent, such as Si, or Ge, etc. Examples of two element congruent melts include $Al_2O_3$, GaAs, etc. Both $SiO_2$, ZnS are not congruent melting. Examples of three element congruent melts include YAG ($Y_3Al_5O_{12}$), $LiNbO_3$, etc. The known numbers of four element congruent melts are even fewer. It turns out that Langasite family compounds have many congruent melting compositions such as LGS, LGN and LGT. Other known four-element congruent melts include GSGG ($Gd_3Sc_2Ga_3O_{12}$), SFAP ($Sr_5P_3O_{12}F$), YCOB ($YCa_4B_3O_{10}$).

One of the interesting things observed with SNGS is the congruent melting nature of this compounds. In fact, Applicants believe that it is among the first known composition systems that contain truly four oxide components (or five elements total) and melt congruently. In other words, each element is located in a specific site without mixing or solid solution among themselves.

For example a Nd doped LGT crystal contains four oxide components, namely, $Nd_2O_3$, $La_2O_3$, $Ta_2O_5$ and $Ga_2O_3$. But it is not a true four component system, since Nd and La occupy the same dodecahedral site and thus structurally they are indistinguishable. Therefore, Nd-LGT is still a three oxide component (or four element) system.

For the compound disclosed here, we found that once the melt composition is properly adjusted, we can practically use the entire melt to grow the crystals. This is significant since this means that there is very little selective evaporation of the components and these crystals are suitable for mass production with very little material waste. This reduces the crystal manufacturing cost.

In addition, among all the oxide components used in the Langasite family compound growth, the most expensive one is $GeO_2$ followed by $Ga_2O_3$. As mentioned earlier, in accordance with the invention, Ge-containing compounds are avoided not just because of their cost, but more so because of their instability due to volatilization of $GeO_2$.

For LGS, LGN and LGT, the use of $Ga_2O_3$ is quite expensive, a 5, 5.5 and 5.5 factor per formula, respectively. This has been a concern for the eventual commercialization of these compounds because of their high chemical cost as compared with quartz ($SiO_2$) or $LiNbO_3$. The industry may be so accustomed to the low cost of quartz and $LiNbO_3$ wafers, it may likely be quite reluctant to accept the high cost of Langasite wafers despite their better properties. In the case of the new compound, the $Ga_2O_3$ usage is reduced by almost half. It will certainly help to reduce the wafer cost.

Another interesting observation is the apparent very strong facet development in crystal external morphology. With the same growth furnace and growth environment, LGS is practically round without a facet. Both LGN and LGT have a slight tendency of facet development. The SNGS compound has a relatively strong facet development. Applicants believe, without wishing to be bound thereto, that the facet development reflects the anisotropy in the octahedral site (Site B). It may affect the microscopic strength of piezoelectricity due to the strong polarizability of Nb. Since the overall piezoelectric strength depends on both the microscopic strength and its geometric arrangement, it is likely that the piezoelectricity can be enhanced.

In the earlier work on LGS, LGT and LGN, Applicants have done extensive investigation on the defect formation in these structures. Both twinning and domain formation were found in earlier work among these three crystals. The types of defects in the two new crystals were also considered closely. So far, there has not been any clear evidence of twinning. The formation of some domain structures was observed, concentrated primarily at the cone region. It can extend into the constant diameter region. Interestingly, unlike LGS, LGT and LGN, the extent of cracking is much less even with domain structures. Perhaps the only reason for the lack of cracking is that the anisotropy of thermal expansion is much less. Based on these qualitative observations, it is expected that the overall properties of this new crystal will be somewhat different from LGS, LGN and LGT.

Applicants theorize, without wishing to be bound thereto, that the ordered crystal structure leads to low acoustic loss, and is therefore well suited for manufacture of high quality factor (Q) bulk acoustic wave resonators useful for clocks and oscillators with high frequency stability, low phase noise and low jitter. The ordered crystal structure may also lead to a high electromechanical coupling factor, and is therefore more suited than quartz for manufacture of bulk acoustic wave filters of wider passband and lower insertion loss. The symmetry of the crystal structure may lead to a range of temperature compensated crystal orientations so that bulk acoustic wave devices manufactured with this ordered Langasite structure compound incur minimal shifts in frequency and group delay induced by ambient temperature variation.

An SNGS crystal was grown by the traditional Czochralski pulling technique in a nitrogen atmosphere. The seed orientation is in (010) direction starting with a 3300-gm mixture of strontium carbonate ($SrCO_3$), Niobium oxide ($Nb_2O_5$), Gallium oxide ($Ga_2O_3$), Silicon oxide ($SiO_2$), all with a purity of 99.99%. The Iridium crucible used is with the diameter of 102 mm and a height of 115 mm. The atomic ratio was Sr:Nb:Ga:Si=3:1:3:2. The crystal obtained was examined by X-ray diffraction, yielding the lattice parameters of a=8.279 Å and c=5.039 Å. The SNGS crystal in accordance with the present invention provided the following comparative characteristics:

| MATERIAL | $K^2$ (%) | SAW VELOCITY | $\epsilon_{11}$ | $\epsilon_{33}$ |
|---|---|---|---|---|
| ST Quartz | 0.134 | 3156 | 4.53 | 4.68 |
| LGS | 0.3~0.38 | 2350 | 19.62 | 49.41 |
| LGN | 0.43 | 2300 | 20.089 | 79.335 |
| LGT | 0.38 | 2220 | 18.271 | 78.95 |
| SNGS | 0.635 | 2840 | 13.63 | 21.92 |

It is further theorized that the containing of heavy elements in the compound reduces the phonon energy of the crystals. It is further theorized that the perfect structural ordering further reduces the incoherent phonon scattering. Combinations of these two properties make the ordered Langasite compounds SNGS produce a higher Q material as compared to other piezoelectric materials. These materials are advantageously used in accordance with the electronic devices and associated methods described above. Other similar devices and methods are disclosed in copending patent applications entitled, "ELECTRONIC DEVICE INCLUDING LANGASITE STRUCTURE COMPOUNDS AND METHOD FOR MAKING SAME", having attorney work docket no. 59625, and "ELECTRONIC FILTER INCLUDING LANGASITE STRUCTURE COMPOUND AND METHOD FOR MAKING SAME", having attorney work docket no. 59684, both filed concurrently herewith, and the entire disclosures of which are incorporated herein by reference.

In addition, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An electronic device comprising:
   a piezoelectric layer comprising an ordered Langasite structure compound having the formula $A_3BC_3D_2E_{14}$, wherein A is strontium, B is niobium, C is gallium, D is silicon, and E is oxygen; and
   at least one electrode connected to said piezoelectric layer.

2. An electronic device according to claim 1 wherein said ordered Langasite structure compound has a substantially perfectly ordered structure.

3. An electronic device according to claim 1 wherein said at least one electrode comprises a plurality of electrodes configured so that the electronic device is a resonator.

4. An electronic device according to claim 3 wherein said plurality of electrodes are connected to a same face of said piezoelectric layer so that the electronic device is a surface acoustic wave (SAW) resonator.

5. An electronic device according to claim 4 wherein said plurality of electrodes comprises first and second interdigitated electrodes.

6. An electronic device according to claim 3 wherein said plurality of electrodes comprises first and second electrodes connected to respective opposing first and second faces of said piezoelectric layer so that the electronic device is a bulk acoustic wave (BAW) resonator.

7. An electronic device according to claim 1 wherein said at least one electrode comprises a plurality of pairs of electrodes configured so that the electronic device is a filter.

8. An electronic device according to claim 7 wherein each of said plurality of pairs of electrodes comprises first and second interdigitated electrodes.

9. An electronic device according to claim 7 wherein said plurality of pairs of electrodes are connected to a same face of said piezoelectric layer so that the electronic device is a surface acoustic wave (SAW) filter.

10. An electronic device according to claim 7 wherein said plurality of pairs of electrodes comprises first and second pairs of electrodes connected to respective opposing first and second faces of said piezoelectric layer so that the electronic device is a bulk acoustic wave (BAW) filter.

11. An electronic device according to claim 1 wherein said ordered Langasite structure compound is producible using a melt pulling crystal growth technique.

12. An electronic device according to claim 1 wherein said ordered Langasite structure compound has a relatively high thermally stability.

13. An electronic device according to claim 1 wherein components of said ordered Langasite structure compound have congruent melting properties.

14. An electronic device comprising:
    a piezoelectric layer comprising an ordered Langasite structure compound having the formula $Sr_3NbGa_3Si_2O_{14}$; and
    a plurality of electrodes connected to said piezoelectric layer and configured so that the electronic device is a resonator.

15. An electronic device according to claim 14 wherein said ordered Langasite structure compound has a substantially perfectly ordered structure.

16. An electronic device according to claim 14 wherein said plurality of electrodes are connected to a same face of said piezoelectric layer so that the electronic device is a surface acoustic wave (SAW) resonator.

17. An electronic device according to claim 16 wherein said plurality of electrodes comprises first and second interdigitated electrodes.

18. An electronic device according to claim 14 wherein said plurality of electrodes comprises first and second electrodes connected to respective opposing first and second faces of said piezoelectric layer so that the electronic device is a bulk acoustic wave (BAW) resonator.

19. An electronic device comprising:
a piezoelectric layer comprising an ordered Langasite structure compound having the formula $Sr_3NbGa_3Si_2O_{14}$; and
a plurality of pairs of electrodes connected to said piezoelectric layer and configured so that the electronic device is a filter.

20. An electronic device according to claim 19 wherein said ordered Langasite structure compound has a substantially perfectly ordered structure.

21. An electronic device according to claim 19 wherein each of said plurality of pairs of electrodes comprises first and second interdigitated electrodes.

22. An electronic device according to claim 19 wherein said plurality of pairs of electrodes are connected to a same face of said piezoelectric layer so that the electronic device is a surface acoustic wave (SAW) filter.

23. An electronic device according to claim 19 wherein said plurality of pairs of electrodes comprises first and second pairs of electrodes connected to respective opposing first and second faces of said piezoelectric layer so that the electronic device is a bulk acoustic wave (BAW) filter.

24. A method for making an electronic device comprising:
providing a piezoelectric layer comprising an ordered Langasite structure compound having the formula $A_3BC_3D_2E_{14}$, wherein A is strontium, B is niobium, C is gallium, D is silicon, and E is oxygen; and
connecting at least one electrode to the piezoelectric layer.

25. A method according to claim 24 wherein the ordered Langasite structure compound has a substantially perfectly ordered structure.

26. A method according to claim 24 wherein connecting at least one electrode comprises connecting a plurality of electrodes configured so that the electronic device is a resonator.

27. A method according to claim 26 wherein connecting the plurality of electrodes comprises connecting the electrodes to a same face of the piezoelectric layer so that the electronic device is a surface acoustic wave (SAW) resonator.

28. A method according to claim 26 wherein connecting the plurality of electrodes comprises connecting first and second electrodes to respective opposing first and second faces of the piezoelectric layer so that the electronic device is a bulk acoustic wave (BAW) resonator.

29. A method according to claim 24 wherein connecting the at least one electrode comprises connecting a plurality of pairs of electrodes configured so that the electronic device is a filter.

30. A method according to claim 29 wherein connecting the plurality of pairs of electrodes comprises connecting the pairs of electrodes to a same face of the piezoelectric layer so that the electronic device is a surface acoustic wave (SAW) filter.

31. A method according to claim 29 wherein connecting the plurality of pairs of electrodes comprises connecting first and second pairs of electrodes to respective opposing first and second faces of the piezoelectric layer so that the electronic device is a bulk acoustic wave (BAW) filter.

32. A method according to claim 24 wherein providing the ordered Langasite structure compound comprises producing the ordered Langasite structure compound using a melt pulling crystal growth technique.

* * * * *